(12) United States Patent
Leroy et al.

(10) Patent No.: US 10,591,997 B2
(45) Date of Patent: Mar. 17, 2020

(54) HAPTIC DEVICE USING VIBRATION-BASED LUBRICATION

(71) Applicant: COMMISSARIAT A L'ENERGIE ATOMIQUE ET AUX ENERGIES ALTERNATIVES, Paris (FR)

(72) Inventors: Edouard Leroy, Paris (FR); Laurent Eck, Saint Lubin de la Haye (FR); Moustapha Hafez, Arcueil (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/317,197

(22) PCT Filed: Jul. 12, 2017

(86) PCT No.: PCT/FR2017/051918
§ 371 (c)(1),
(2) Date: Jan. 11, 2019

(87) PCT Pub. No.: WO2018/011522
PCT Pub. Date: Jan. 18, 2018

(65) Prior Publication Data
US 2019/0294248 A1 Sep. 26, 2019

(30) Foreign Application Priority Data

Jul. 13, 2016 (FR) ...................... 16 56723

(51) Int. Cl.
*G06F 3/01* (2006.01)
*G06F 3/048* (2013.01)
(Continued)

(52) U.S. Cl.
CPC ............... *G06F 3/016* (2013.01); *G05G 5/03* (2013.01); *G06F 3/0338* (2013.01);
(Continued)

(58) Field of Classification Search
CPC ........ G06F 3/016; G06F 3/048; G06F 3/0362; G06F 3/0338; G06F 3/03548;
(Continued)

(56) References Cited

U.S. PATENT DOCUMENTS

2003/0184518 A1 10/2003 Numata et al.
2009/0134744 A1* 5/2009 Yoon ...................... H02N 2/163
310/323.06
(Continued)

FOREIGN PATENT DOCUMENTS

EP  1 349 050 A2  10/2003

OTHER PUBLICATIONS

International Search Report dated Dec. 20, 2017 in PCT/FR2017/051918 filed on Jul. 12, 2017.
(Continued)

*Primary Examiner* — Hoi C Lau
(74) *Attorney, Agent, or Firm* — Oblon, McClelland, Maier & Neustadt, L.L.P.

(57) ABSTRACT

A haptic device with ultrasonic actuation, including: a support, a user-interaction element movable at least in rotation and/or translation relative to the support, a first contact surface that moves as one with the interaction element, a second contact surface that moves as one with the support, resonators, and a control unit that excites the resonators at at least one resonance frequency, generating a vibration mode in a plane and an ultrasonic lubrication phenomenon between the first contact surface and the second contact surface.

14 Claims, 5 Drawing Sheets

(51) Int. Cl.
*H02N 2/00* (2006.01)
*H02N 2/18* (2006.01)
*G05G 5/03* (2008.04)
*G06F 3/0362* (2013.01)
*G06F 3/0338* (2013.01)
*G06F 3/0354* (2013.01)
*G05G 1/08* (2006.01)
*H01H 3/00* (2006.01)

(52) U.S. Cl.
CPC ........ *G06F 3/0362* (2013.01); *G06F 3/03548* (2013.01); *G06F 3/03549* (2013.01); *G06F 3/048* (2013.01); *H02N 2/001* (2013.01); *H02N 2/181* (2013.01); *G05G 1/08* (2013.01); *H01H 2003/008* (2013.01); *H03K 2217/96062* (2013.01)

(58) Field of Classification Search
CPC .... G06F 3/03549; H02N 2/001; H02N 2/181; G05G 5/03; G05G 1/08
See application file for complete search history.

(56) References Cited

U.S. PATENT DOCUMENTS

| | | | |
|---|---|---|---|
| 2011/0115754 A1* | 5/2011 | Cruz-Hernandez | G05G 1/08 345/184 |
| 2019/0267965 A1* | 8/2019 | Gorman | H03H 9/02433 |
| 2019/0286237 A1* | 9/2019 | Eck | G05G 9/047 |
| 2019/0294248 A1* | 9/2019 | Leroy | H02N 2/181 |

OTHER PUBLICATIONS

Preliminary French Search Report dated Mar. 27, 2017 in FR 1656723 filed on Jul. 13, 2016.
Chang, K-T. et al., "Design and implementation of a piezoelectric clutch mechanism using piezoelectric buzzers", Sensors and Actuators A: Physical, vol. 141, 2008, pp. 515-522, XP022452397.
Koyama, T. et al., "Development of an Ultrasonic Clutch for Multi-Fingered Exoskeleton Haptic Device using Passive Force Feedback for Dexterous Teleoperation", Proceedings of the 2003 IEEE/RSJ International Conference on Intelligent Robots and Systems, vol. 3, Oct. 27, 2003, pp. 2229-2234, XP010675407.

* cited by examiner

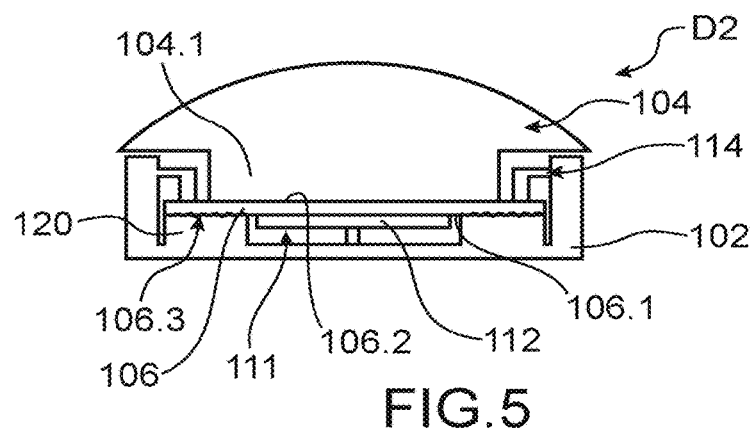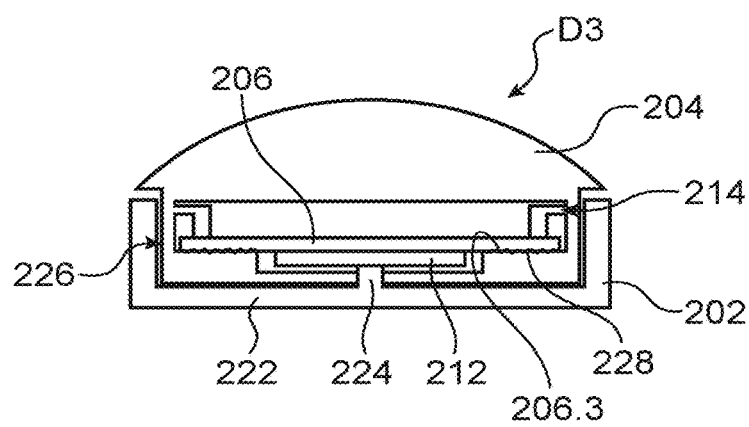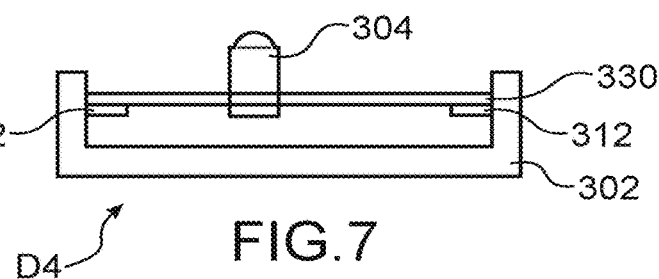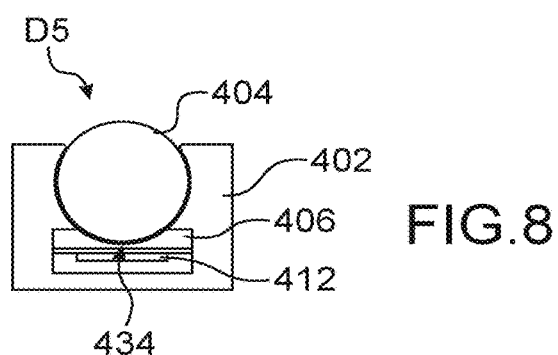

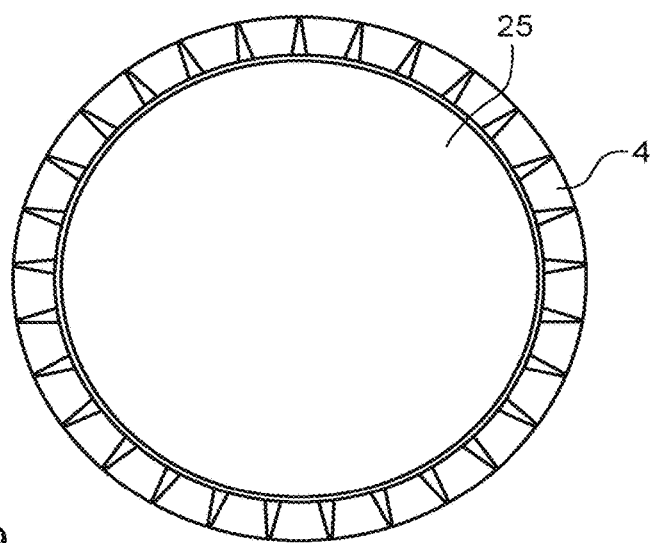
FIG.9
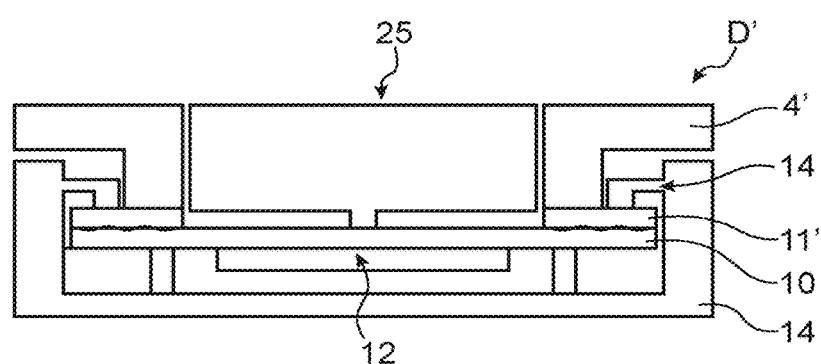
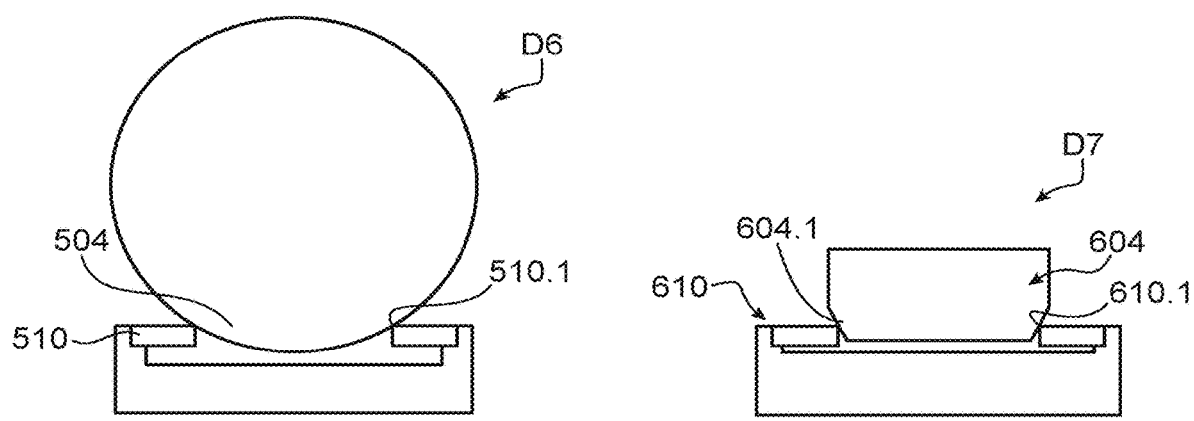
FIG.10  FIG.11

HAPTIC DEVICE USING VIBRATION-BASED LUBRICATION

TECHNICAL FIELD AND STATE OF PRIOR ART

The present invention relates to a haptic device implementing a vibration lubrication.

A haptic device enables a user to have an interaction with a machine for example. The user feels a haptic feedback upon handling a haptic device, for example as notches or a mechanical stop. The interaction between the user and the machine is thereby enhanced and can be more intuitive. The haptic device takes the form of a rotary knob, in this case the interface puts up a user resisting torque as a function of the angular position of the actuation knob and the movement applied by the user, thus enabling haptic patterns to be defined, which will be felt by the user when it rotates the knob.

As a variant the haptic interface can take the form of a linearly moving knob. The haptic interface provided with the haptic device has the advantage of being reconfigurable and thus of adapting to the current interaction.

There are several technologies to generate this haptic feedback.

One of these technologies implements motors which generate a torque onto the knob but they have the drawback of being bulky.

The resisting torque can be generated by a magnetorheological fluid to which a magnetic field is applied, which depends on the torque desired to be generated. For example, the higher the magnetic field, the more the fluid viscosity increases, and the higher the torque applied to the knob. Haptic devices implementing such a fluid are of a high performance but they can have some bulk and can comprise a great number of mechanical parts.

Another technology is fully electrical and implements a piezoelectric material. Document Koyama, Tatsuya, Kenjiro Takemura, and Takashi Maeno. "*Development of an Ultrasonic Brake.*" Journal of Advanced Mechanical Design, Systems, and Manufacturing 1, no. 1 (2007): 122-129 describes an ultrasonic brake that can be used in haptic devices. The ultrasonic brake implements a piezoelectric disk attached to a vibrating device, the whole forming a stator, wherein a rotor is disposed on the disk. By supplying the piezoelectric disk such that it vibrates at an eigen frequency of 21.5 kHz, an off-plane vibration normal to the plane is generated, which generates pressure waves and creates an air film between the stator and the rotor. Thereby, there is an intermittent or almost continuous separation of the surfaces.

This device requires a relatively thick vibrating device resulting in some bulk.

There are also interfaces as a touch surface, on which a finger moves. The user feels a haptic feedback as a function of the finger's position for example. The haptic feedback is generated by piezoelectric resonators located below the surface. The resonators are energised such that ultrasonic vibrations normal to the touch surface are generated, which modulates the friction felt at a finger moving on the surface. This interface type raises design problems in terms of force and position sensor and in terms of ultrasonic energisation. Further, the effect of vibrations may not be present on the entire touch surface.

DISCLOSURE OF THE INVENTION

Consequently, a purpose of the present invention is to offer a haptic device with a simple structure, offering an improved haptic feedback and having a reduced bulk.

The purpose of the present invention is achieved by a haptic device comprising a support, a user interaction element which can be at least rotationally and/or translationally moved with respect to said support, a first contact zone movably secured to the interaction element, a second contact zone movably secured to the support, at least one resonator, energising means of the resonator at at least one resonance frequency such that it generates an in-plane vibration mode and the occurrence of a vibration lubrication phenomenon between the first contact zone and the second contact zone.

The resonator preferably comprises a piezoelectric material. As a variant, it could for example comprise a magnetostrictive material.

The inventors have discovered that the implementation of an in-plane vibration mode was substantially more efficient to generate a lubrication than a vibration mode orthogonal to the plane generating a levitation phenomenon implemented by the devices of the state of the art. The in-plane vibration mode generates an in-plane slip and causes the occurrence of a lubrication.

The implementation of an in-plane vibration mode is particularly advantageous in the case of a rotary haptic knob, because the tangential forces generated add up at the radial end of the resonator, causing an amplification in the lubrication effect. The zone at which the lubrication occurs can thereby be advantageously limited to an annular zone.

The implementation of an in-plane vibration mode does not require a thick vibrating device. The bulk of the haptic device can be reduced.

The haptic device can comprise a user interaction element which is rotationally or translationally movable.

Very advantageously, the resonance frequency is an ultrasonic frequency so as to generate an ultrasonic lubrication.

Thereby, the subject-matter of the present invention is a haptic device comprising a support, a user interaction element able to be at least rotationally and/or translationally moved with respect to said support, a first contact zone movably secured to the interaction element, a second contact zone movably secured to the support, at least one first resonator, a control unit such that it energises the resonator at at least one resonance frequency generating an in-plane vibration mode and the occurrence of a vibration lubrication phenomenon between the first contact zone and the second contact zone.

Preferably, the resonance frequency is between 70 kHz and 200 kHz so as to generate an ultrasonic lubrication.

In an exemplary embodiment, the first resonator comprises a plate and a pellet of a material able to generate vibrations which is attached to said plate, one of the faces of the first plate forming the first contact zone or the second contact zone.

In another exemplary embodiment, the first resonator comprises a plate and a pellet of a material able to generate vibrations which is attached to said plate, one of the faces of the first plate forming the first contact zone and said device comprising a second resonator comprising a plate and a pellet of a material able to generate vibrations which is attached to said plate, one of the faces of the first plate forming the second contact zone.

In an embodiment in which the interaction element is able to be rotationally moved, the first contact zone and/or the second contact zone can be of an annular shape.

In one embodiment in which the interaction element is able to be translationally moved along a longitudinal axis, the second contact zone can be carried by a beam suspended to the support and extending along the longitudinal axis and at least one element of a material able to generate vibrations can be attached to the beam.

The device can advantageously comprise at least one detector of the position of the interaction element relative to the support. The position sensor is for example magnetic.

Also advantageously, the haptic device can comprise a sensor of detecting the user's intention in order to detect the forces exerted by the user before the interaction element is rotated. The sensor of detecting the user's action intention can for example comprise a torque sensor in the case of a rotationally movable interaction element.

According to an additional characteristic, the control unit can be a microcontroller type electronic controller, advantageously associated with an amplifier and a frequency controller.

In one advantageous example, at least one of the first and second contact zones is of brass.

In an exemplary embodiment, the first and second zones are held in contact with each other by elastic means.

BRIEF DESCRIPTION OF THE DRAWINGS

The present invention will be better understood upon reading the description that follows and the appended drawings in which:

FIG. 5 is a schematic representation of a longitudinal cross-section view of another example of a rotary haptic knob according to the invention comprising a single resonator, FIG. 6 is a schematic representation of a longitudinal cross-section view of another example of a rotary haptic knob according to the invention comprising a single resonator, FIG. 7 is a schematic representation of a longitudinal cross-section view of an example of a translationally movable haptic knob according to the invention, FIG. 8 is a schematic representation of a longitudinal cross-section view of an example of a sphere-shaped haptic knob according to the invention, FIG. 9 is a schematic representation of a top view and of a longitudinal cross-section view of a haptic knob according to another exemplary embodiment, FIG. 10 is a schematic representation of a longitudinal cross-section view of another example of a sphere-shaped haptic knob according to the invention implementing a linear contact, FIG. 11 is a schematic representation of a longitudinal cross-section view of an example of a rotary haptic knob according to the invention implementing a linear contact.

DETAILED DISCLOSURE OF PARTICULAR EMBODIMENTS

Figure 1:
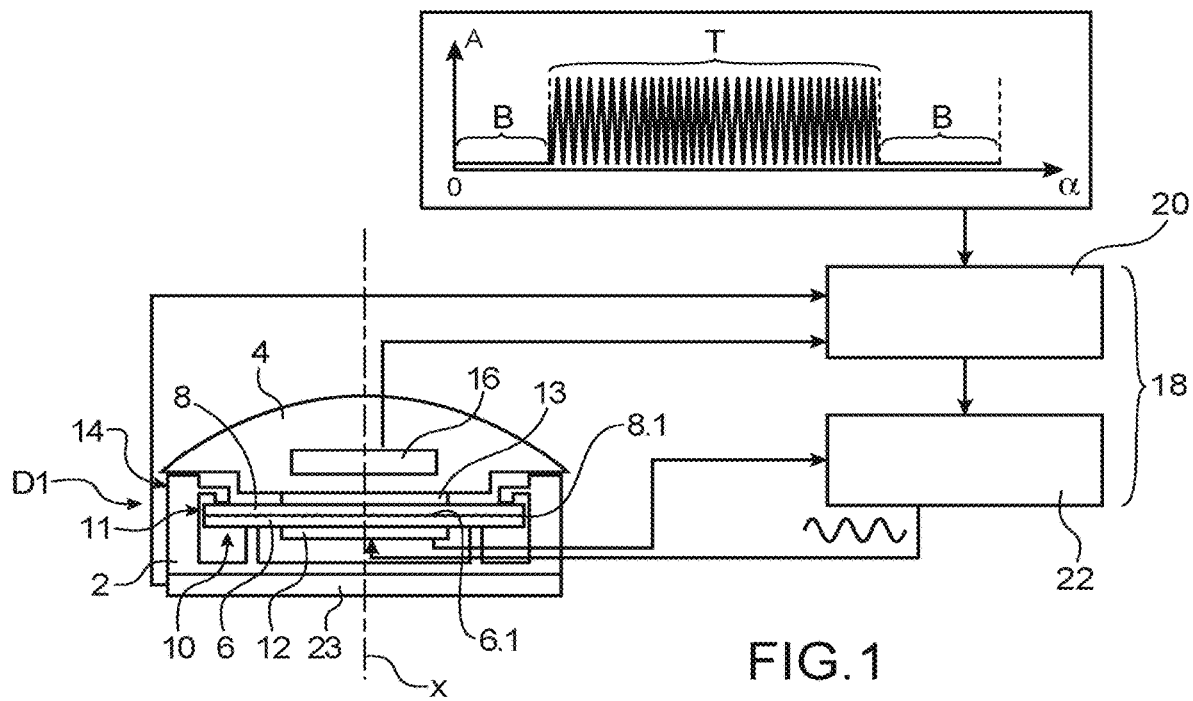
FIG. 1 is a schematic representation of a longitudinal cross-section view of an example of a rotary haptic knob according to the invention.
Figure 2:
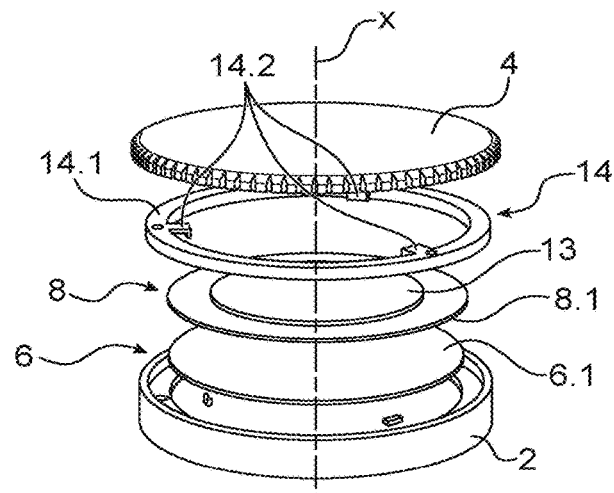
FIG. 2 is an exploded view of a practical embodiment of the rotary haptic knob of FIG. 1.

In FIGS. 1 and 2, a schematic representation and an exploded representation respectively of an example of rotary haptic device according to the invention can be seen. The rotary haptic device D1 comprises a casing 2 and a user interaction element 4 pivotably mounted with respect to the casing about a longitudinal axis X. The interaction element 4 will be designated in the following of the description with "knob". The knob 4 is for being handled by a user, for example one or more user's fingers for at least rotating it about the axis X.

The device comprises at least one first resonator 10 comprising a plate 6 and an actuator 12 of a material able to generate vibrations.

The material able to generate vibrations is preferably a piezoelectric material. As a variant, it could be for example a magnetostrictive material, for example galfenol.

For the sake of simplicity, the material able to generate vibrations will be designated in the following of the description with "piezoelectric material".

In the example represented, the device comprises a second resonator 11 comprising a second plate 8 and an actuator 13 of a piezoelectric material.

The actuators 12, 13 are advantageously formed by pellets of piezoelectric material.

The resonators extend in two parallel planes perpendicular to the axis of rotation.

The first plate 6 is stationary relative to the casing and the second plate 8 is stationary with respect to the knob, each plate 6, 8 has the shape of a disk coaxial to the longitudinal axis X and comprises a first face 6.1, 8.1 in contact with each other.

The pellet 13 is attached to a second face 6.2 of the plate 6 and the pellet 12 is attached to a second face 8.2 of the plate 8.

Preferably, the plates 6, 8 are made in a wear resistant material offering a sufficient friction coefficient between them. The plates 6, 8 are for example of brass. Preferably, the friction coefficient in the absence of vibration between both plates 6, 8 is higher than or equal to 0.25.

Further, the material of the plates is chosen so as to have good acoustic properties in order to offer a device with a low-level noise running or at least with a reduced sound level.

The piezoelectric pellet is for example of Lead Zirconate-Titanate (PZT) or Poly(vinylidene fluoride) (PVDF) and for example with a thickness between 0.1 mm and 1 mm.

The plate(s) 6, 8 is (are) for example of brass, aluminium or epoxy type polymer.

As a variant, it can be contemplated to cover at least the faces of the pellets contacting a layer of a polymeric material, for example of the epoxy type.

According to another variant, the pellets are made of a wear resistant piezoelectric material having a sufficient friction coefficient. The pellets are thus directly contacting each other. The pellets could for example be made of a polymeric material having piezoelectric properties.

Each piezoelectric pellet or actuator is attached to the plate such that the vibrations generated by energising the piezoelectric material are transmitted to the plate, the whole forming a resonator.

Preferably, the first plate 6 is supported in the casing by several discrete zones, for example three in number in order to limit damping of the vibrations applied by the pellet. The first plate 6 is for example attached to the casing by gluing.

Advantageously, the device comprises means for holding both first surfaces 6.1, 8.1 mechanically pressed against each other. In the example represented, these are elastic means 14 which apply a given pre-load to the second plate 8 towards the first plate 6. In the example represented, the elastic means 14 comprise a support ring 14.1 and fingers 14.2 radially projecting from the support ring and axially bearing against the second face 8.2 of the second plate 8 towards the first plate 6. The fingers 14.2 apply the pre-load to the second plate. The pre-load could be made by using metal compression springs of a known type or leaf type flat springs, placed between the resonator and the framework.

The pressure exerted by the spring between both plates ensures the maximum braking force of the brake when it does not operate and the stationary state of both plates in the absence of vibration lubrication.

As a variant, these means could be magnetic. Other means could also be contemplatable. As a further variant, it could be contemplated that the pressing force exerted by the user replaces all or part of the pressure exerted by the spring or by other means.

The piezoelectric actuators are connected to an energy source so as to energise the actuators at a resonance frequency such that the resonator is vibrated according to an in-plane vibration mode.

The resonance frequency having an in-plane vibration mode is at least equal to 10 kHz. Preferably, the resonance frequency having an in-plane vibration mode is between 70 kHz and 200 kHz in order to generate an ultrasonic lubrication. The sound level of the device in use is thereby reduced.

By "in-plane vibration mode", it is meant a vibration mode in which the movements generated by energising the piezoelectric material have directions parallel to the plane of the resonator. The vibration direction is in this case normal to the direction of pre-stress applied by the spring.

The haptic device also comprises at least one angular position sensor 16 for the knob 4 and a control unit 18 in order to control the resonators 10, 11 for making haptic patterns (FIG. 1).

The position sensor 16 is such that it enables the knob angular position to be detected with respect to the casing with sufficient dynamics to be able to reproduce the wanted haptic pattern.

Advantageously, the position sensor is a magnetic sensor, this having the advantages of being compact and ready to integrate.

As a variant, this could be an optical sensor such as an optical wheel, or a sensor of any other type having sufficient dynamics.

The control unit 18 is for example a microcontroller type electronic controller. It modulates the apparent friction coefficient as a function of the position of the knob and a preset pattern. This controller is preferably associated with an amplifier 20 and a frequency controller 22 in order to maintain the energisation at resonance.

The implementation of a position sensor enables realistic feelings to be achieved.

According to a variant embodiment, in place of or in addition to a position sensor, an amplitude modulation of the vibrations as a function of time can be provided. Such a modulation could for example enable the user to count seconds or feel a music rhythm independently of the amplitude of the motion he/she causes at the interface.

The haptic device is for exerting a resisting strain opposing the knob movements. This resisting strain is determined from preset haptic patterns as a function of the haptic rendering desired to be reproduced, these patterns are recorded in a data base.

A pattern is defined as a resisting strain or a braking strain to apply as a function of the following data for example:
 the current knob angular position,
 the current knob direction of rotation,
 the knob moving speed.

A haptic pattern is thus a set of braking strain values to apply to the knob, i.e. a set of values defining the pattern, each value of the haptic pattern is associated with a given angular position of the knob and to a direction of rotation of the knob. Each braking strain value corresponds to a friction coefficient value between both plates 6 and 8, which corresponds to a vibration amplitude value of the resonator which corresponds to a current intensity supplying the actuator.

It will be understood that the same pattern value can be assigned for different angular positions or in the case of a linear interface for several different linear positions. Further, different values can be assigned according to the moving direction.

In the device according to the invention, the maximum braking strain is achieved when no energisation is applied to the resonator.

In FIG. 1, a schematic representation of a haptic pattern which corresponds to a value of the vibration amplitude A as a function of the angular position a of the knob can be seen. This pattern is recorded in a database accessible by the control unit 18. The zones designated with B correspond to the simulation of stops and the zone designated T with corresponds to the simulation of a textured surface.

A virtual stop is defined by a haptic pattern for which a very high braking strain is applied to the knob, i.e. in the absence of energisation, such that the knob cannot be moved in a given direction. The virtual stop is defined by an angular zone inside which the haptic pattern should be applied according to a given knob direction of rotation.

Very advantageously, the haptic device also comprises a sensor of detecting the user's intention 23 in order to detect the forces exerted by the user before the knob is rotated. Thereby, the information about the direction of rotation is early detected which enables the haptic rendering to be improved. This determination of the user's action intention can be made by measuring the force exerted on the knob by virtue of the deformation of an interface element, this is the measurement of a torque in the case of a rotary knob. This information thus enables possible simulations to be enhanced, in particular the simulation of a stop from stop type haptic patterns.

The operation of the haptic device is the following one.

The user moves the knob 4 about the axis X, the position sensor and advantageously the sensor of detecting the user's action intention detect the knob angular position and advantageously the direction in which the user intends to act on the knob respectively. This information are sent to the control unit 18 which generates a command as a function of the haptic pattern to reproduce. The actuator(s) is (are) supplied with current or voltage the frequency of which is such that the resonator(s) is (are) energised at a frequency close to or equal to one of their resonance frequencies corresponding to an in-plane vibration mode. For such a vibration mode, the vibrations generated are tangential to the surface. The forces are generated in the plane between the fixed part and the movable part, and the moving amplitudes add up at the radial end of the resonators, causing a movement in the shearing plane, i.e. normal to the pre-load, resulting in a radial tangential slip perpendicular to the direction of rotation and an ultrasonic lubrication effect between the fixed part and the movable part. Both surfaces remain substantially in contact, independently on the pressing force exerted on the knob 4 and the friction coefficient between both pellets is strongly decreased. The user can rotate the knob nearly without friction.

Figure 12:
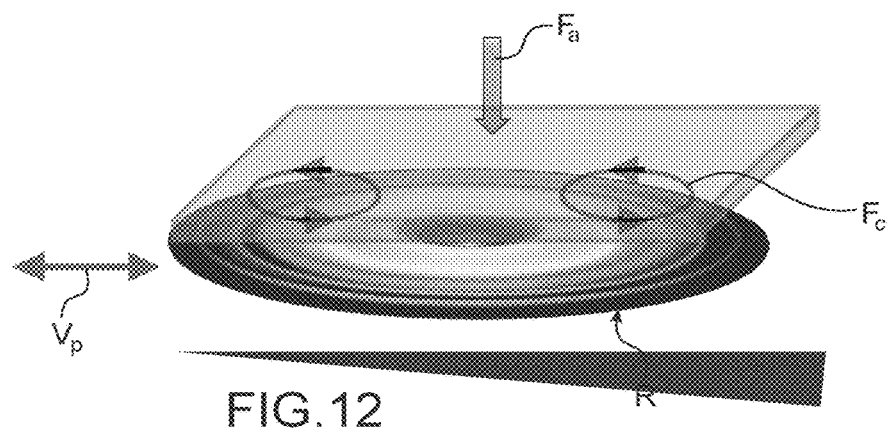
FIG. 12 is a schematic representation of the zone of occurrence of in-plane vibrations.

In FIG. 12, a schematic representation of the contact zone can be seen. The vibrations tangential to the plane Vp because of the in-plane mode and the shearing forces Fc resulting therefrom are represented. Fa is the pressing force exerted on the interaction element or knob. In this representation, a single resonator R is used.

The material(s) of the actuator(s) undergo(es) deformations with compression zones and in-plane expansion zones.

For a given material, with given dimensions and given boundary conditions (embedment, stress), the tangential i.e. in-plane vibration, is obtained for one or more specific frequencies. For a thin material, i.e. having a low thickness with respect to its other dimensions, this frequency is generally higher than that causing the first normal, i.e. off-plane vibratory resonance mode to occur.

Figure 13:
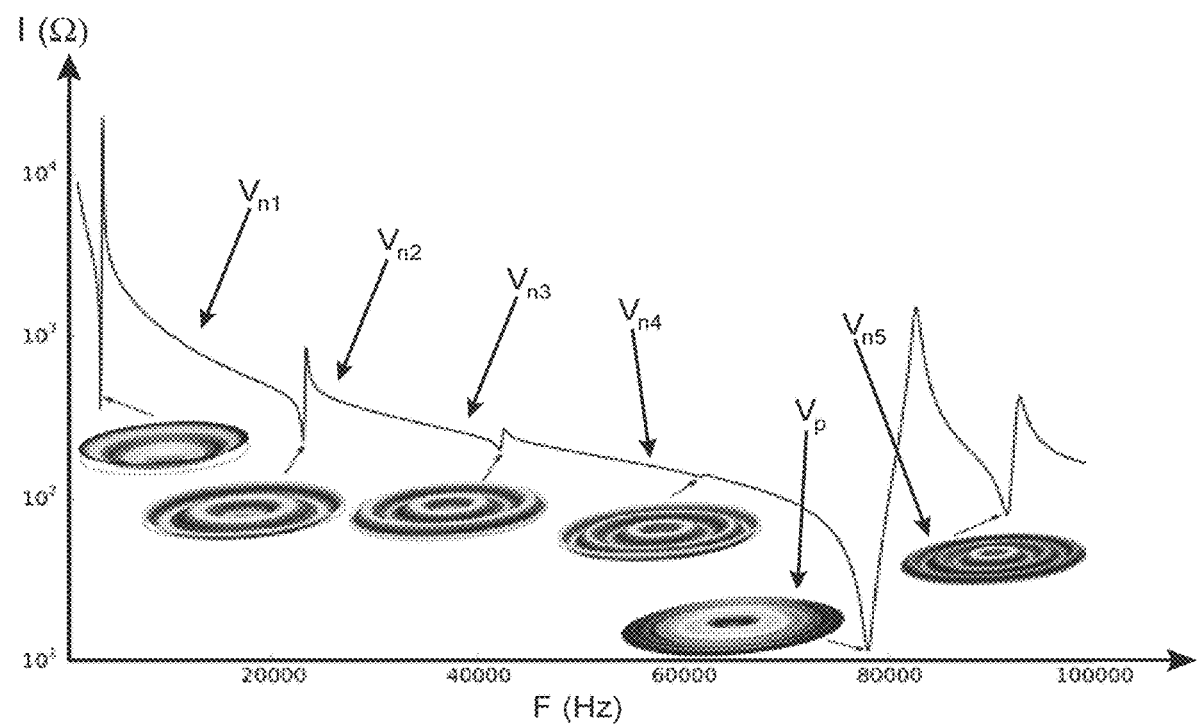
FIG. 13 is a schematic representation of the resonance modes of a resonator comprising off-plane and in-plane vibration modes.

In FIG. 13, a representation of the resonance modes of a resonator can be seen, from the impedance variation I in Ohm as a function of the frequency F in Hz. In this example, the occurrence of an in-plane vibration mode Vp, i.e. in the plane occurs at approximately 78 kHz, whereas the first frequency Vn1 to which an off-plane or plane-normal vibration mode occurs is 5 kHz, the other frequencies represented also correspond to off-plane vibration modes Vn2, Vn3, Vn4, Vn5.

Figure 3:
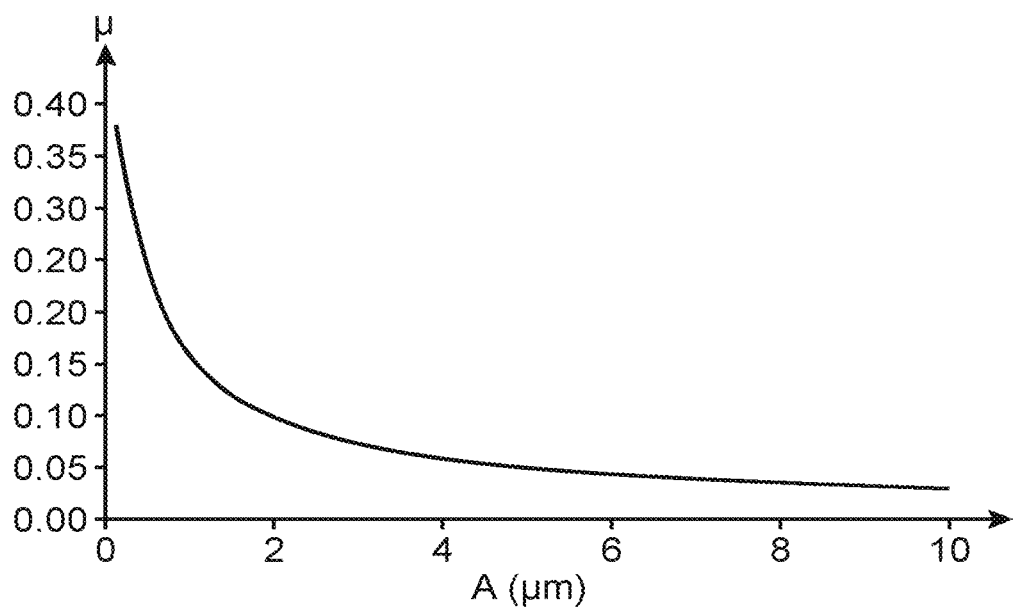
FIG. 3 is a graphical representation of the variation in the friction coefficient between the contact surfaces as a function of the vibration amplitude.

In FIG. 3, the friction coefficient as a function of the vibration tangential amplitude in μm can be seen for a knob with a diameter of 35 mm by assessing the angular maximum speed reached at 1 rpm ($V_0$max=0.1 m/s). The resonance frequency is in the order of 75 kHz.

Generally, with the actuators implemented, a tangential amplitude in the order of 3 μm can be reached. For such an amplitude, the friction coefficient is strongly lowered.

Figure 4:
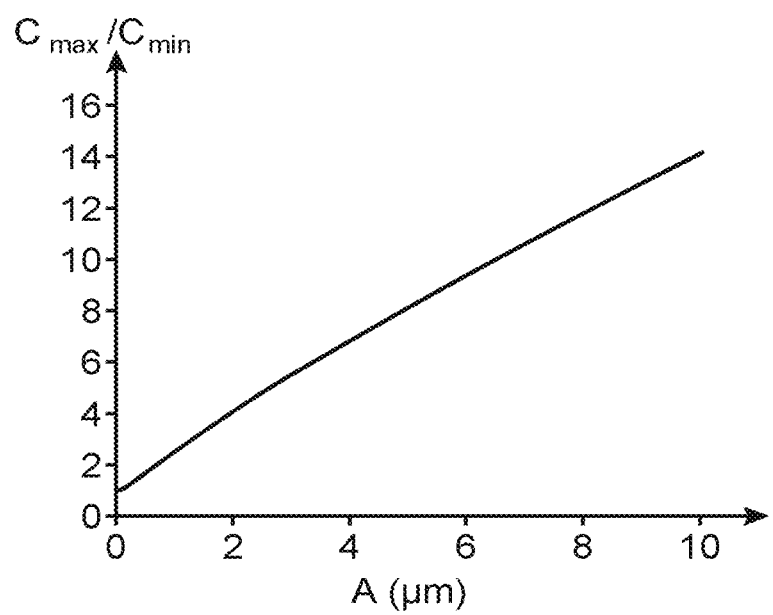
FIG. 4 is a graphical representation of the variation in the maximal torque/minimal torque ratio exerted on the interaction element as a function of the vibration amplitude.

In FIG. 4, the ratio of the maximum torque to the minimum torque Cmax/Cmin applied to the knob as a function of the vibration tangential amplitude can be seen. For an amplitude in the order of 3 μm, a torque ratio of 5 is obtained. The torque that can thus be exerted on the knob is all the greater as the friction coefficient decreases, and thus the vibration amplitude increases.

The simulated feeling type can be chosen by varying the vibration amplitude as is illustrated in FIG. 3. By increasing or decreasing the vibration amplitude, the frictions are respectively decreased or increased. Therefore, the control unit modifies the vibration amplitude as a function of the knob position according to the haptic pattern to reproduce. The vibration amplitude depends on the standard of the energising current or voltage supplying the actuator(s).

Further, by modulating the spatial frequency of the vibration, i.e. by modifying the amplitude variation of the vibration as a function of the knob movement, it is possible to modify the feeling felt by the user. For example, when the vibration is modulated as a high spatial frequency, for example lower than one mm, a texture feeling can be reproduced, and when the vibration has a low spatial frequency, for example higher than one mm, individual notches can be reproduced.

Unlike magnetorheological fluid haptic devices for example, in the absence of electric power supply, the knob is braked, in other words it is normally braked, the lubrication only occurring when the actuator is electrically supplied. In a magnetorheological fluid haptic device, the fluid viscosity and thus the braking force increase with the magnetic field. In the absence of field, only the friction of the magnetorheological fluid at rest is responsible for braking.

In an advantageous embodiment, the resonator(s) of the device comprise(s) a disk of a piezoelectric material and a ring. Indeed, as explained above, the in-plane movement occurs at the outer radial edge of the resonator. An annular contact can thus be sufficient. In the case of a device with two resonators, the other resonator can have the same structure or else comprise a vibrating plate attached to the piezoelectric pellet. In the case of a device with one resonator, the facing surface could be formed by a plate or a ring.

In FIG. 9, a device D1' which differs from D1 in that the resonator 11' is of a ring shape can be seen. The knob 4' also has a ring shape.

Advantageously and as is represented in FIG. 9, the zone inside the annular resonator and the knob 4' is used to place a watch dial type display device or touch screen 25, or comprise other control knobs (music, etc.).

It will be understood that a device comprising a single resonator which is annular or identical to one of the resonators 10 and 11 of the device D1 and the facing surface for example movably integral with the knob only formed by a ring does not depart from the scope of the present invention.

In FIG. 5, another exemplary embodiment of a haptic device according to the invention can be seen.

The device D2 comprises a casing 102, a knob 104 pivotably mounted about a longitudinal axis X with respect to the casing and a resonator 111.

The resonator 111 comprises a disk-shaped plate 106 rotationally integral with the knob and a piezoelectric pellet 112 attached to the first face 106.1 of the plate 106. The knob 104 comprises an axial projection 104.1 attached to a central zone of the second face 106.2. The plate 106 is bearing against the casing through its first face 106.1. In the example represented, the casing comprises a shoulder 120 on which the first face 106.2 of the plate 106 rests through an annular surface 106.3 located radially outwardly. Elastic means 114 bearing against the second face 106.2 hold the annular surface 106.3 and the shoulder in contact.

In this example, the pellet 12 being rotationally movable, its supply is made by a rotary electrical contact.

The device D2 has the advantage of using only one active part.

The operation of the device D2 is similar to that of the device D1. The pellet 112 is energised so as to vibrate the resonator in the in-plane mode. The vibrations are transmitted to the radial edge of the plate 106 in contact with the shoulder 120. A transverse slip between the plate 106 and the shoulder 120 occurs, resulting in an ultrasonic lubrication which can be modulated as a function of the haptic pattern.

In FIG. 6, another exemplary embodiment of a haptic device D3 can be seen. The device D3 comprises a single fixed resonator 210 in the casing 202.

The casing 202 comprises a bottom 222 provided with a projection 224 on which the piezoelectric pellet attached to a plate 206 rests; the projection 224 forms an electrical contact for supplying the pellet. The knob comprises a structure 226 integral with a side of the knob 204 opposite to that for being handled by the user. The structure is such that it enables the knob to be rotated relative to the casing about the projection 224 and surrounds the resonator. The structure 226 comprises a contact surface 228 in contact with an annular surface 206.3 radially outwardly of the plate 206. In this example, the contact annular surface 206.3 of the plate 206 in contact with the knob is located on the same face as the piezoelectric pellet. The structure also integrates elastic means 214 holding the plate 206 and the contact surface 228 integral with the knob in contact.

This device has the advantage of implementing a fixed resonator and of not requiring a rotary electrical contact.

The operation of the device D3 is similar to that of the device of D2.

In FIG. 11, another example of a rotation knob D7 can be seen, in which the knob is in annular linear contact with the resonator.

The resonator 610 has the form of a ring suspended on the support and the knob 604 comprises a flared base 604.1 which bears against the internal edge 610.1 of the resonator 610. When the resonator is energised, a lubrication occurs between the surface of the flared base 604.1 and the internal edge 610.1 of the resonator.

In FIG. 7, another exemplary embodiment of a haptic device D4 in which the knob is translationally movable can be seen.

The device D4 comprises a casing 302, a knob 304 slidably mounted along a beam 330 suspended in the casing 302.

The device also comprises one or more piezoelectric elements 332 able to vibrate the beam 330. In the example represented, the device comprises two elements of a piezoelectric material 312 with a rectangular or square shape, each attached to a longitudinal end of the beam 330. The resonator extends in the plane of the beam. The vibrations generated are parallel to the plane of the resonator.

The knob is such that it surrounds the beam 330. Advantageously, the pre-load elastic means (not represented) are integrated to the knob.

The device D4 is a non-limiting exemplary embodiment. For example, it could be foreseen to revert the movable part and the fixed part. The operation is similar to those of the devices already described. An acoustic lubrication occurs between the beam and the knob.

As a variant, the resonator could be integrated to the knob.

In FIG. 8, another exemplary embodiment of a haptic device D5 in which the interaction element is formed by a sphere 404 can be seen. The resonator 410 comprises a plate 406 suspended in a casing 402 and comprises a cavity 434 with a diameter close or identical to that of the sphere. A piezoelectric pellet 412 is attached to a face of the plate 406 opposite to that comprising the cavity 434.

When the pellet 412 is energised, a lubrication effect occurs between the surface of the cavity 434 and the external surface of the sphere 404, and the sphere can be moved more or less readily about its centre.

In FIG. 10, another exemplary embodiment of a haptic device D6 close to that of D5 can be seen, which is different in that the contact between the sphere 504 and the resonator 510 is an annular linear contact. The resonator 510 is in the form of a ring the internal edge 511 of which acts as a bearing surface for the sphere. When the resonator 510 is energised, a lubrication effect occurs between the edge 511 of the resonator and the sphere.

In the case of a haptic interface comprising a rotationally movable knob, it can be foreseen that this is also translationally movable along the axis of rotation for example to make a selection and/or validation action.

By virtue of the invention, a rotary "knob" or linear slide type haptic device can be made, enabling reconfigurable notches and stops to be created. Indeed, it is easy to modify the braking strain applied to the interaction element by modifying the amplitude of the in-plane vibrations on demand.

Such a device is of a substantially simpler design than that of touch interfaces, in particular in terms of force and position sensor and ultrasonic energisation. Indeed, problems of vibration troughs and nodes which occur during a resonating energisation and which are annoying upon using this effect for a touch surface explored with the finger are avoided. Some local effects are such that the effect generated is not present throughout the plate.

The invention claimed is:

1. A haptic device comprising:
   a support;
   a user interaction element configured to be at least rotationally and/or translationally moved with respect to the support;
   a first contact zone movably secured to the user interaction element;
   a second contact zone movably secured to the support;
   at least one position detector detecting a position of the user interaction element relative to the support;
   at least one first resonator;
   a control unit configured to energize the resonator at at least one resonance frequency generating an in-plane vibration mode and occurrence of a vibration lubrication phenomenon between the first contact zone and the second contact zone.

2. The haptic device according to claim 1, wherein the resonance frequency is between 70 kHz and 200 kHz to generate an ultrasonic lubrication.

3. The haptic device according to claim 1, wherein the first resonator comprises a plate and a pellet of a material, able to generate vibrations, attached to the plate, one of the faces of the first plate forming the first contact zone or the second contact zone.

4. The haptic device according to claim 1, wherein the first resonator comprises a plate and a pellet of a material, able to generate vibrations, attached to the plate, one of the faces of the first plate forming the first contact zone; and
   the device further comprising a second resonator comprising a plate and a pellet of a material, able to generate vibrations, attached to the plate, one of the faces of the first plate forming the second contact zone.

5. The haptic device according to claim 1, wherein the user interaction element is configured to be rotationally moved, and wherein the first contact zone and/or the second contact zone are of an annular shape.

6. The haptic device according to claim 1, wherein the user interaction element is configured to be translationally moved along a longitudinal axis, the second contact zone being carried by a beam suspended to the support and extending along the longitudinal axis and at least one element of a material able to generate vibrations being attached to the beam.

7. The haptic device according to claim 1, wherein the position detector is magnetic.

8. The haptic device according to claim 1, further comprising a sensor detecting the user's intention to detect forces exerted by the user before the user interaction element is rotated.

9. The haptic device according to claim 8, wherein the sensor detecting the user's action intention comprises a torque sensor in a case of a rotationally movable user interaction element.

10. The haptic device according to claim 1, wherein the material able to generate vibrations is a piezoelectric material.

11. The haptic device according to claim 1, wherein the control unit is a microcontroller type electronic controller.

12. The haptic device according to claim 1, wherein at least one of the first and the second contact zones is of brass.

13. The haptic device according to claim 1, wherein the first and second zones are held in contact with each other by an elastic mechanism.

14. The haptic device according to claim 1, wherein the control unit is a microcontroller type electronic controller associated with an amplifier and a frequency controller.

* * * * *